US008514159B2

(12) United States Patent
Hirama

(10) Patent No.: US 8,514,159 B2
(45) Date of Patent: Aug. 20, 2013

(54) LIQUID CRYSTAL DRIVE DEVICE

(75) Inventor: Atsushi Hirama, Chiba (JP)

(73) Assignee: Lapis Semiconductor Co., Ltd., Tokyo (JP)

(*) Notice: Subject to any disclaimer, the term of this patent is extended or adjusted under 35 U.S.C. 154(b) by 845 days.

(21) Appl. No.: 12/081,536

(22) Filed: Apr. 17, 2008

(65) Prior Publication Data

US 2008/0284802 A1 Nov. 20, 2008

(30) Foreign Application Priority Data

May 17, 2007 (JP) ................................ 2007/132197

(51) Int. Cl.
*G09G 3/36* (2006.01)
*G09G 3/32* (2006.01)
*H03M 7/34* (2006.01)

(52) U.S. Cl.
USPC ................................ 345/89; 345/204; 341/51

(58) Field of Classification Search
USPC .................. 345/87, 88, 89, 92, 95, 205, 206, 345/210, 692, 693, 51, 204; 349/144, 145; 341/51, 144, 145
See application file for complete search history.

(56) References Cited

U.S. PATENT DOCUMENTS

| | | | | |
|---|---|---|---|---|
| 3,699,568 | A * | 10/1972 | Thompson et al. | 341/153 |
| 4,591,826 | A * | 5/1986 | Seiler | 341/154 |
| 6,844,839 | B2 * | 1/2005 | Lee et al. | 341/144 |
| 7,006,027 | B2 | 2/2006 | Lan et al. | |
| 7,362,300 | B2 * | 4/2008 | Hirama | 345/98 |
| 7,423,572 | B2 * | 9/2008 | Nakayama et al. | 341/145 |
| 7,893,892 | B2 * | 2/2011 | Tamura et al. | 345/76 |
| 2003/0151578 | A1 * | 8/2003 | Morita | 345/89 |
| 2003/0160743 | A1 * | 8/2003 | Yasuda | 345/76 |
| 2004/0021627 | A1 * | 2/2004 | Maki | 345/89 |
| 2006/0082483 | A1 * | 4/2006 | Lan et al. | 341/144 |
| 2006/0192695 | A1 * | 8/2006 | Nishimura | 341/51 |
| 2007/0120792 | A1 * | 5/2007 | Sasaki et al. | 345/89 |
| 2007/0171169 | A1 * | 7/2007 | Hirama | 345/94 |

FOREIGN PATENT DOCUMENTS

JP 2006-050572 A * 2/2006

OTHER PUBLICATIONS

Thomas, et al., Circuits and Signals: An Introduction to Linear and Interface Circuits, 1984, John Wiley and Sons Inc., 1st Ed., pp. 41-53.*

Thomas, et al., Circuits and Signals: An Introduction to Linear and Interface Circuits, 1984, John Wiley and Sons Inc., 1st Ed., pp. 33, 41-53.*

* cited by examiner

*Primary Examiner* — Quan-Zhen Wang
*Assistant Examiner* — Michael J Eurice
(74) *Attorney, Agent, or Firm* — Rabin & Berdo, P.C.

(57) ABSTRACT

The present invention provides a liquid crystal drive device comprising a first gradation voltage generating circuit having a plurality of first wirings led out from a first string resistor thereof, a second gradation voltage generating circuit having a plurality of second wirings led out from a second string resistor thereof having a resistance value higher than the first string resistor and respectively connected to voltage-follower connected op amplifiers, a plurality of DA converters to which the first wirings and the op amplifiers are respectively connected, and an output op amplifier connected to the DA converters respectively.

7 Claims, 7 Drawing Sheets

LOAD: DECODER CONTROL SIGNAL

LIQUID CRYSTAL DRIVE DEVICE

BACKGROUND OF THE INVENTION

The present invention relates to a liquid crystal drive device used in a liquid crystal display device or the like.

With upsizing of a panel of a recent liquid crystal display device, it has been desirable to improve various performance of a liquid crystal drive device for the recent liquid crystal display device. In order to adapt to the upsizing of the panel and an improvement in image quality, double-speed drive has been used and speeding-up has been required even for the liquid crystal drive device. The liquid crystal display device is equipped with a plurality of liquid crystal drive devices, and the number of the liquid crystal drive devices mounted with the upsizing of its panel is also increasing.

FIG. 7 of Japanese Unexamined Patent Publication No. 2006-050572 (patent document 1) shows a 3-bit string resistor type D/A converter. In the string resistor type D/A converter, the number of elemental devices is doubled and the area is also doubled each time the number of bits for gradation voltages increases by one simply. The patent document 1 describes the invention that can be realized without increasing the number of circuit constituent elements abruptly even when gradation voltages required due to an increase in the number of display colors, multigradation, etc. increase.

As shown in FIG. 10, a liquid crystal display device 1000 is equipped with a large number of liquid crystal drive devices shown in FIG. 7 and disclosed in the above-described patent document 1. Source drivers 1010 have string resistors respectively. The string resistors are respectively supplied with a plurality of reference voltages from a reference voltage generating circuit 1030. The string resistors of the plurality of source drivers 1010 are connected in parallel to the reference voltage generating circuit 1030. It is common that a string resistance value is generally set lower than 10 kΩ. When, however, a wiring area on a substrate for mounting the reference voltage generating circuit 1030 and the like is reduced, each wiring resistance on the substrate becomes very high, so that the string resistance value is affected by the wiring resistance, thus exerting an influence on the display.

FIG. 8 shows a simplified model of a source driver applied to FIGS. 10 and 7. FIG. 9 shows voltage transitions at respective points or places in FIG. 8. Voltages V1 and V2 are supplied from the reference voltage generating circuit 1030. A decoder 830 selects a voltage lying between the voltages V1 and V2 according to image data and outputs each voltage corresponding to the data through an amplifier. Data is outputted from a latch circuit to the decoder 830 according to a Load signal. Here, the op amplifier AMP requires an input capacitance. The input capacitance is generally about 1 pF or so. When 400 outputs exist per source driver, there is a need to charge 400 pF in total through two 5-kΩ resistors in parallel.

A recent liquid crystal display device however requires enhancement of the speed of writing into a liquid crystal due to an increase in frame frequency and an increase in the number of respective outputs. It has also been desired to enhance the speed of charging for the input capacitance of an op amplifier AMP in like manner. When the string resistor is set to 10 kΩ or higher to reduce the influence of the wiring resistance in particular in the case shown in FIG. 8, the RC time constant is expressed in the following equation:

$$2.5\ \text{k}\Omega \times 400\ \text{pF} = 1.0\ \mu\text{s}$$

Thus, the time required to perform 90% charging becomes about 3 μs and hence a delay occurs in an output waveform.

SUMMARY OF THE INVENTION

The present invention has been made in view of the above points. It is therefore an object of the present invention to provide a liquid crystal drive device capable of quickly charging an input capacitance of an output op amplifier even when it needs to maintain a resistance value of a string resistor high.

According to one aspect of the present invention, for attaining the above object, there is provided a liquid crystal drive device comprising a first gradation voltage generating circuit having a plurality of first wirings led out from a first string resistor thereof, a second gradation voltage generating circuit having a plurality of second wirings led out from a second string resistor thereof having a resistance value higher than the first string resistor and respectively connected to voltage-follower connected op amplifiers, a plurality of DA converters to which the first wirings and the op amplifiers are respectively connected, and an output op amplifier connected to the DA converters respectively.

A liquid crystal drive device of the present invention is capable of driving a liquid crystal display device at high speed by taking the constitution of the invention.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
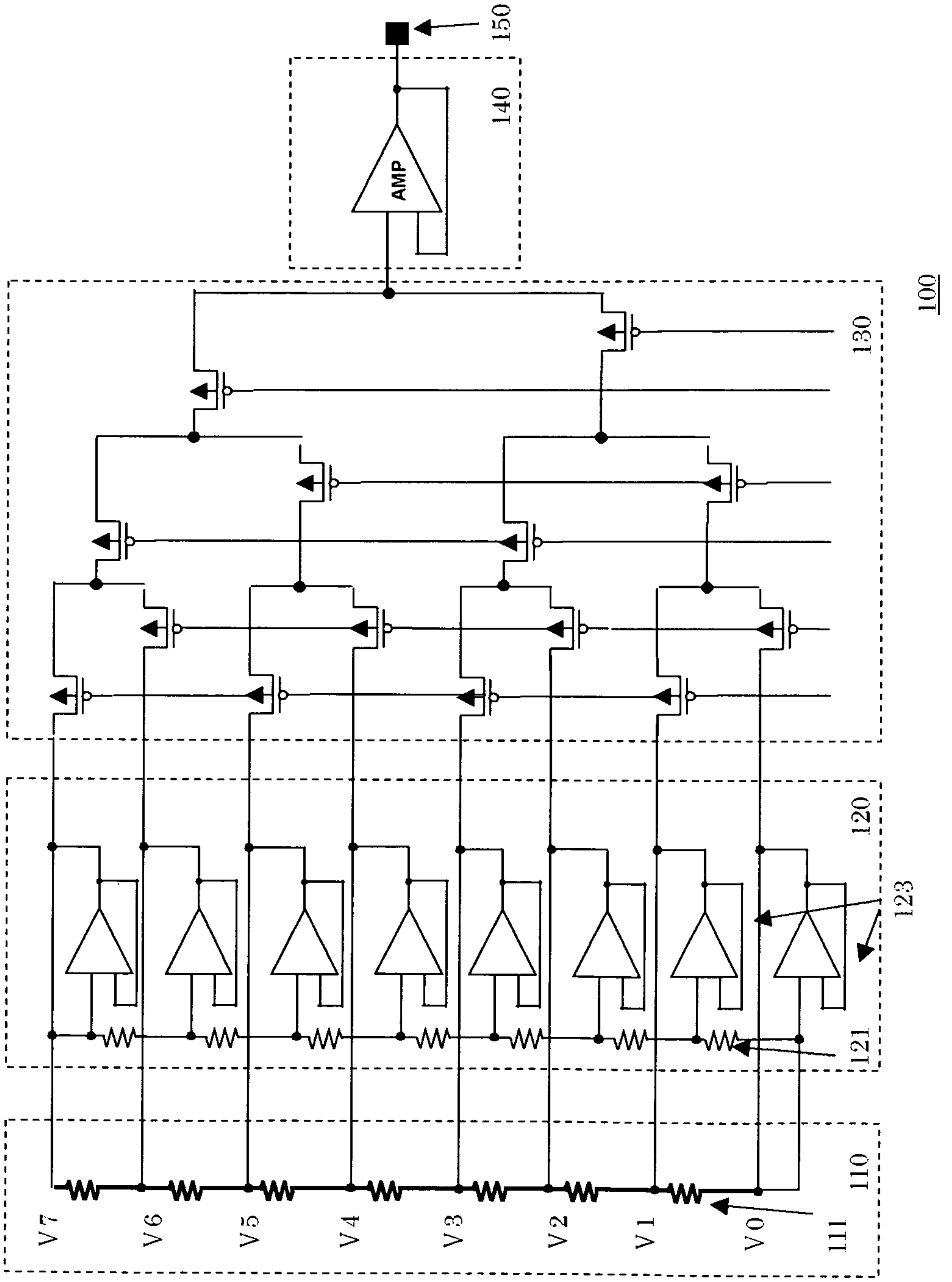
FIG. 1 is a circuit diagram showing a liquid crystal drive device according to a first embodiment of the present invention.

Preferred embodiments of the present invention will hereinafter be described with reference to the accompanying drawings. Incidentally, the same reference numerals are respectively attached to constituent elements having approximately identical functions and configurations in the following description and accompanying drawings, and dual explanations thereof will therefore be omitted.

First Preferred Embodiment

FIG. 1 is a circuit diagram of a liquid crystal drive device 100 according to a first embodiment of the present invention. The configuration of the present embodiment will first be explained. The liquid crystal drive device 100 is a circuit that converts a 3-bit digital signal to an analog signal. The liquid crystal drive device 100 includes, as minimum constituent requirements, a first gradation voltage generating circuit 110, a second gradation voltage generating circuit 120, a DA converter 130 and an op amplifier 140. The first gradation voltage generating circuit is a circuit that generates a plurality of gradation voltages and outputs V0 through V6 obtained by developing voltage drops across a string resistor 111 from a voltage V7 sequentially. The voltages V0 through V7 are sequentially reduced from V7 to V0. V0 through V7 are generically called "gradation voltages" subsequently.

The second gradation voltage generating circuit 120 is provided with a string resistor 121 connected in parallel to the first gradation voltage generating circuit 110. Op amplifiers 123 are connected to their corresponding nodes of the string resistor 121. The Op amplifiers 123 are voltage-follower connected and the outputs of the Op amplifiers 123 are connected to their corresponding nodes of the first gradation voltage generating circuit. Incidentally, the combined resistance value of the string resistor 121 is a value larger than that of the string resistor 111. For example, the combined resistance value of the string resistor 111 is 10 kΩ, and the combined resistance value of the string resistor 121 is 100 kΩ. The string resistor 111 is realized by 10 kΩ to 50 kΩ realistically.

The string resistor 121 is set to a large value to some degree in such a manner that the combined resistance value of the string resistor 111 is not lowered. It is considered that 50 kΩ or higher is required in terms of empirical rules of the inventors. It is desirable that the resistance value of the string resistor 121 is set to ten times the resistance value of the string resistor 111 to do with a decrease of about 10% or so in the combined resistance value, although depending on the resistance value of the string resistor 111.

The DA converter 130 inputs therein the outputs of the first gradation voltage generating circuit 110 and the second gradation voltage generating circuit 120 and selects and outputs gradation voltages according to digital data. The first gradation voltage generating circuit 110 and the second gradation voltage generating circuit 120 are respectively connected from the string resistors 111 and 121 to the DA converter via lead wires. It is desirable that the string resistor 111 and the string resistor 121 are identical in gamma curve. The DA converter 130 is provided in plural form. The plurality of the DA converters 130 are connected in parallel to the first gradation voltage generating circuit 110 and the second gradation voltage generating circuit 120. The op amplifier 140 is provided at each of the DA converters 130. A voltage selected by each DA converter 130 is outputted from an output terminal 150.

Figure 2:
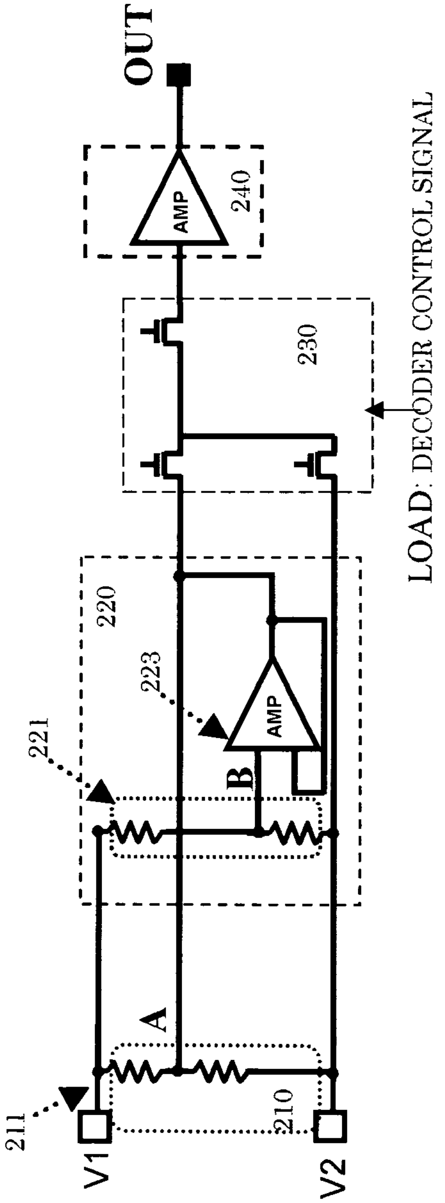
FIG. 2 is a circuit diagram illustrating a liquid crystal drive device according to the first embodiment of the present invention.
Figure 3:
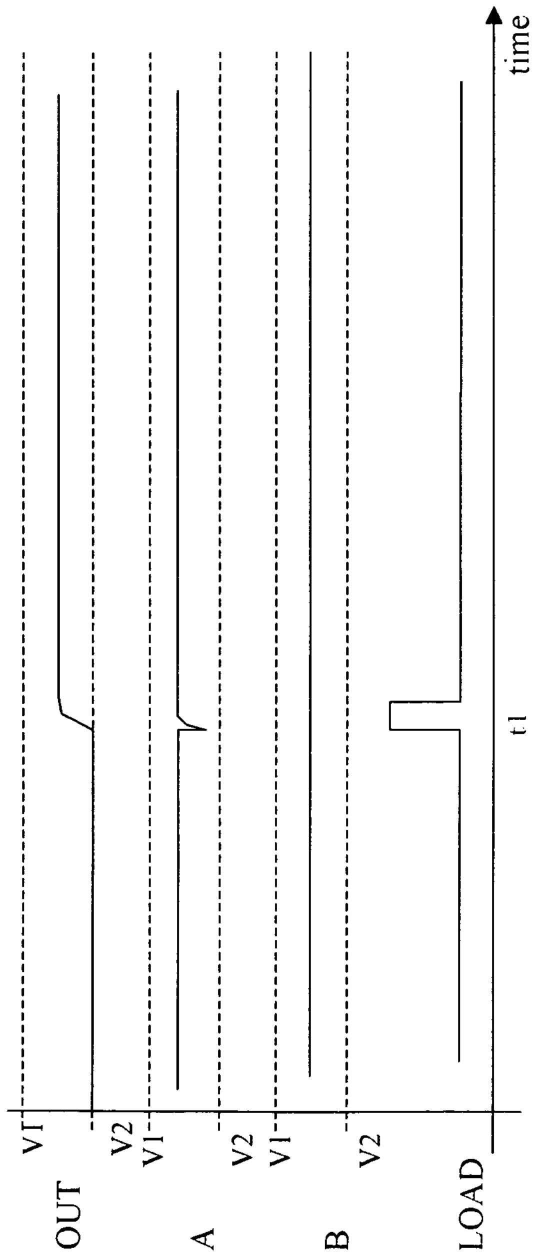
FIG. 3 is a timing chart of the liquid crystal drive device shown in FIG. 2.

The operation of the liquid crystal drive device will next be explained. FIG. 2 is a liquid crystal drive device showing a simplified model of the liquid crystal drive device shown in FIG. 1. FIG. 3 is a timing chart showing voltage transitions of the liquid crystal drive device shown in FIG. 2. Reference numerals of FIG. 2 identical in one place and tens place within the reference numerals shown in FIG. 1 are described as ones each having the same function.

When a pulse is inputted to a LOAD signal at a time t1, a DA converter 230 selects a gradation voltage corresponding to digital data and starts to charge the input capacitance of an op amplifier 240. A first gradation voltage generating circuit 210 comprises a string resistor 211 having a combined resistance value equivalent to that of a conventional string resistor. A node A corresponds to an output node of the first gradation voltage generating circuit 210. Since the node A is low as the resistance, a voltage drop is developed temporarily upon charging the input capacitance of the op amplifier 240.

On the other hand, a second gradation voltage generating circuit 220 is constituted of a string resistor 221 large in resistance value as compared with the first gradation voltage generating circuit 210. Therefore, a voltage drop is almost undeveloped even upon charging the input capacitance of the op amplifier 240. Thus, an op amplifier 223 of the second gradation voltage generating circuit 220 operates in response to a voltage drop at the node A, so that a potential is supplied thereto. Therefore, the node A is quickly returned to a predetermined potential.

The provision of the second gradation voltage generating circuit 220 makes it possible to increase or enhance the charging speed of the input capacitance of the op amplifier 240 while the string resistor 211 of the first gradation voltage generating circuit 210 is being maintained at a high resistance value, thereby enabling high-speed drive of a liquid crystal display device.

Second Preferred Embodiment

Figure 4:
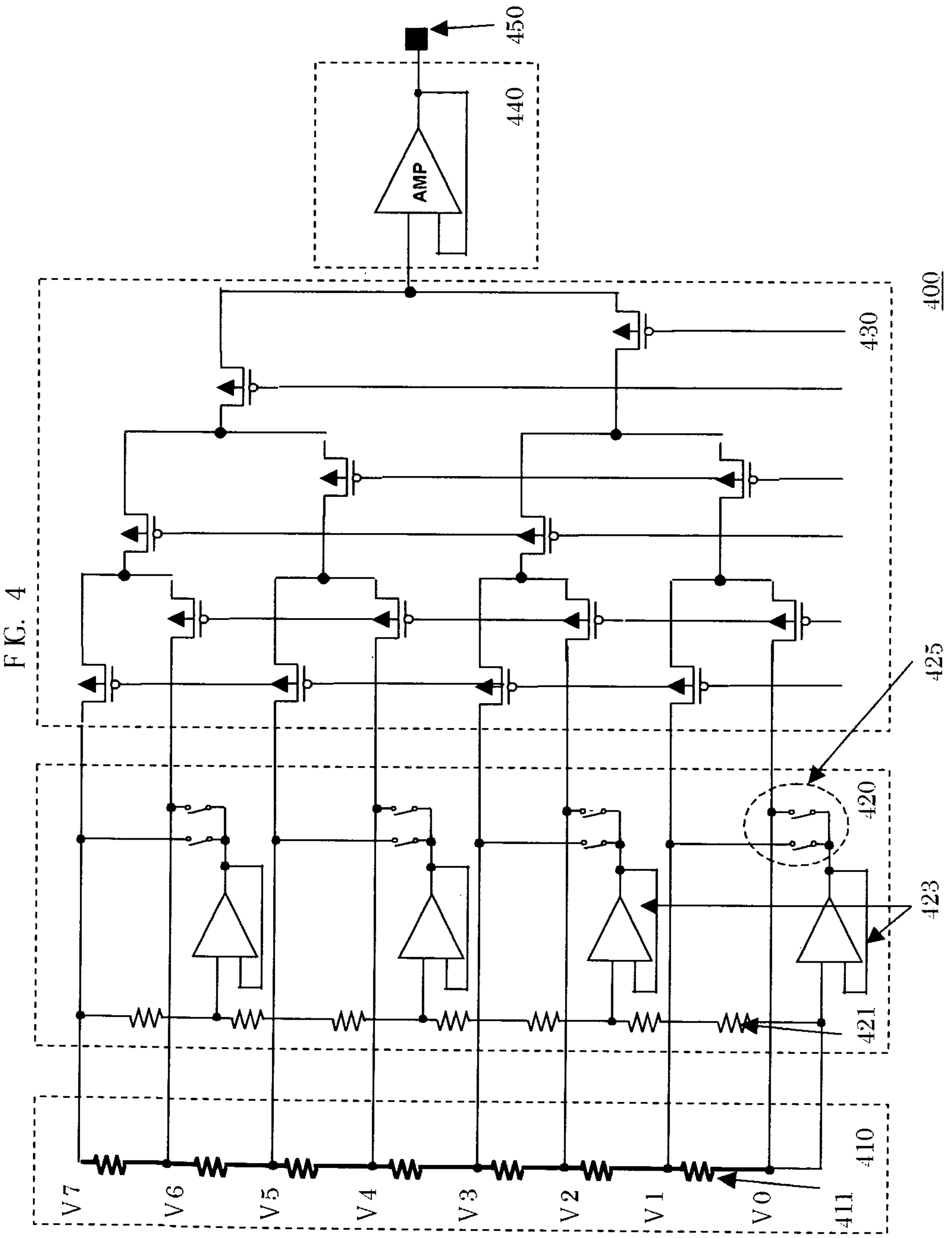
FIG. 4 is a circuit diagram showing a liquid crystal drive device according to a second embodiment of the present invention.
Figure 5:
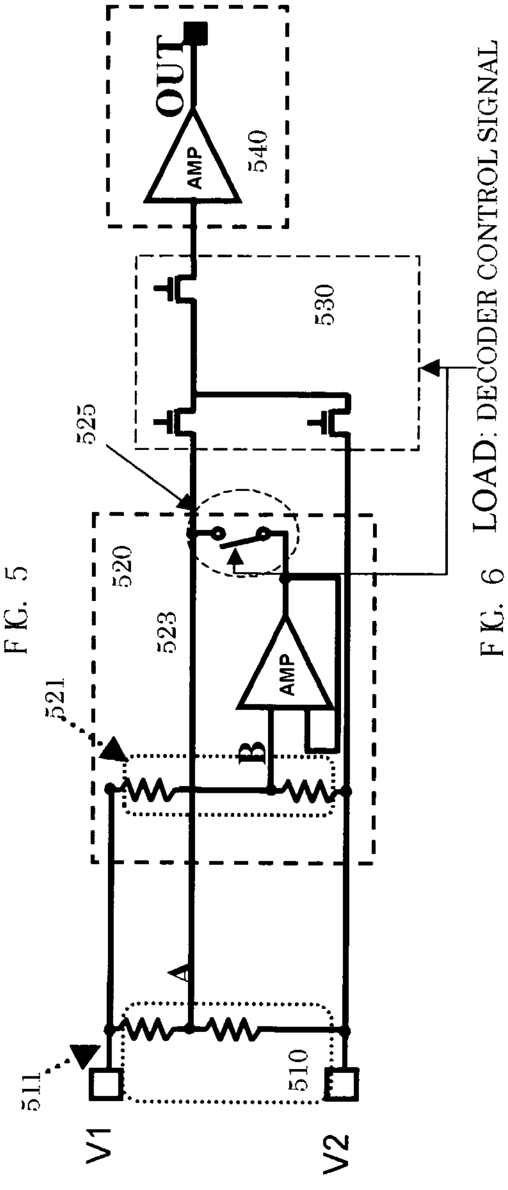
FIG. 5 is a circuit diagram illustrating a liquid crystal drive device according to the second embodiment of the present invention.
Figure 6:
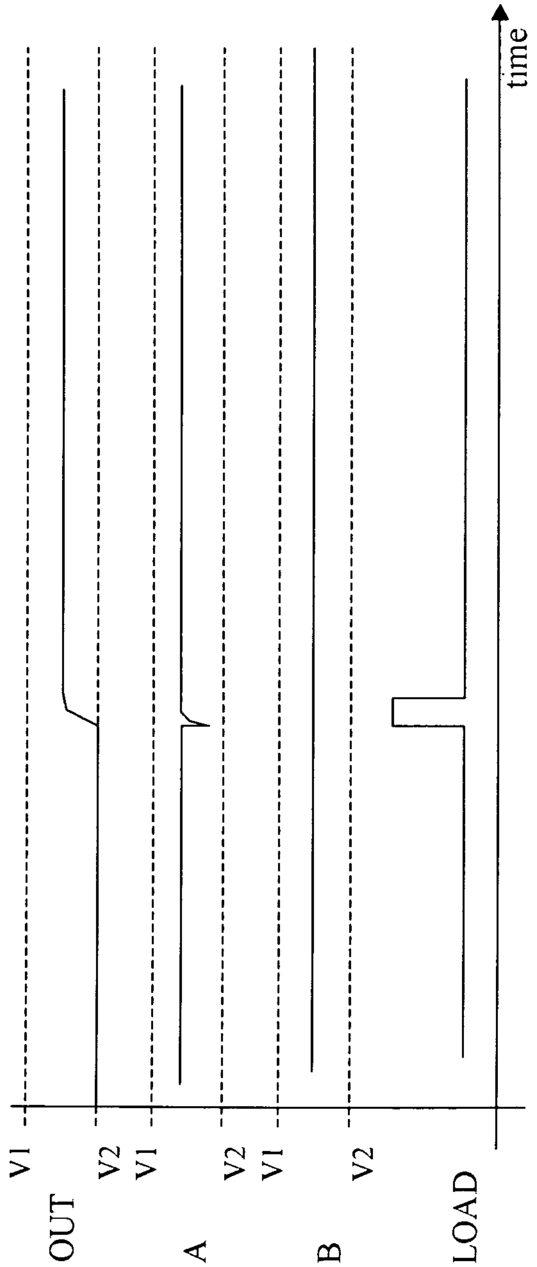
FIG. 6 is a timing chart of the liquid crystal drive device shown in FIG. 5.
Figure 7:
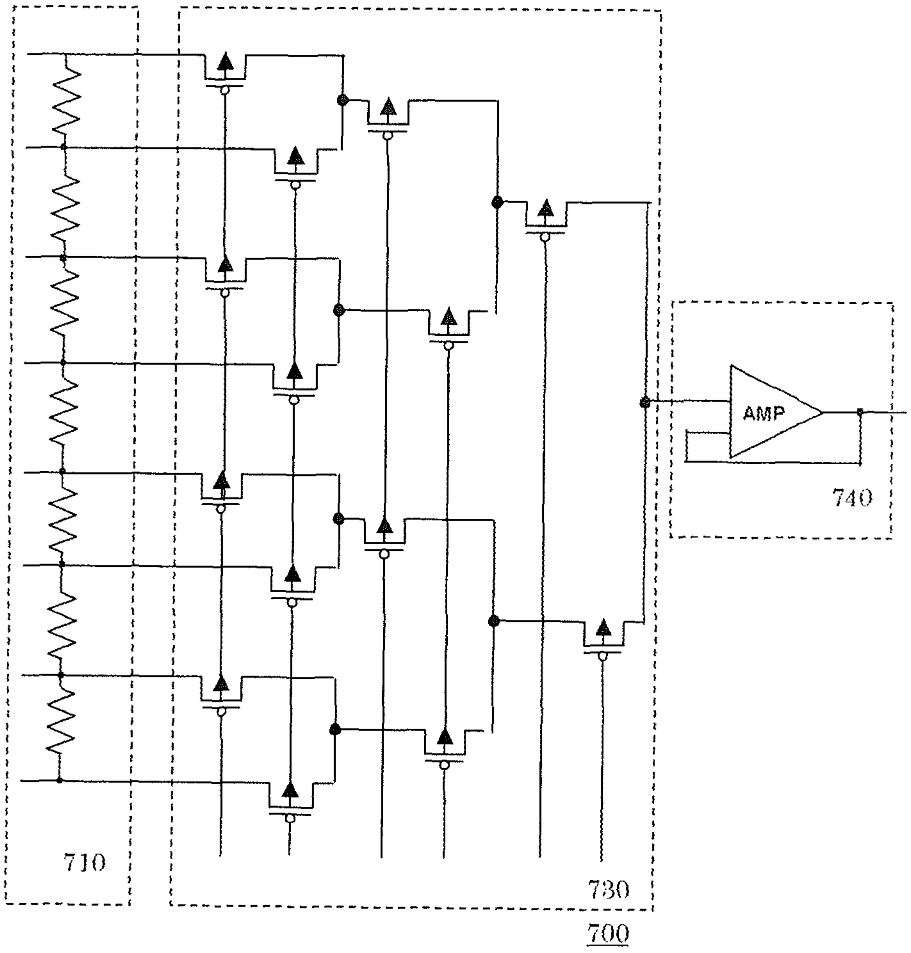
FIG. 7 PRIOR ART
FIG. 7 is a circuit diagram showing a conventional liquid crystal drive device.
Figure 8:
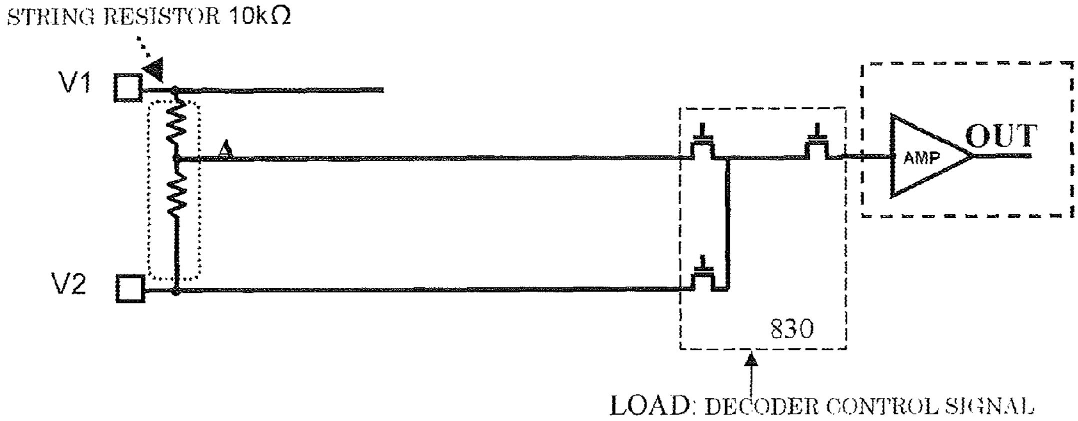
FIG. 8 PRIOR ART
FIG. 8 is a circuit diagram illustrating a conventional liquid crystal drive device.
Figure 9:
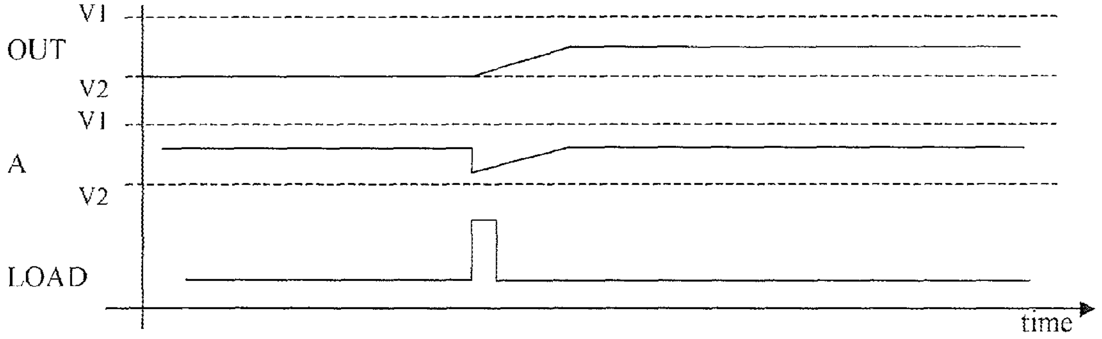
FIG. 9 PRIOR ART
FIG. 9 is a timing chart of the liquid crystal drive device shown in FIG. 8.
Figure 10:
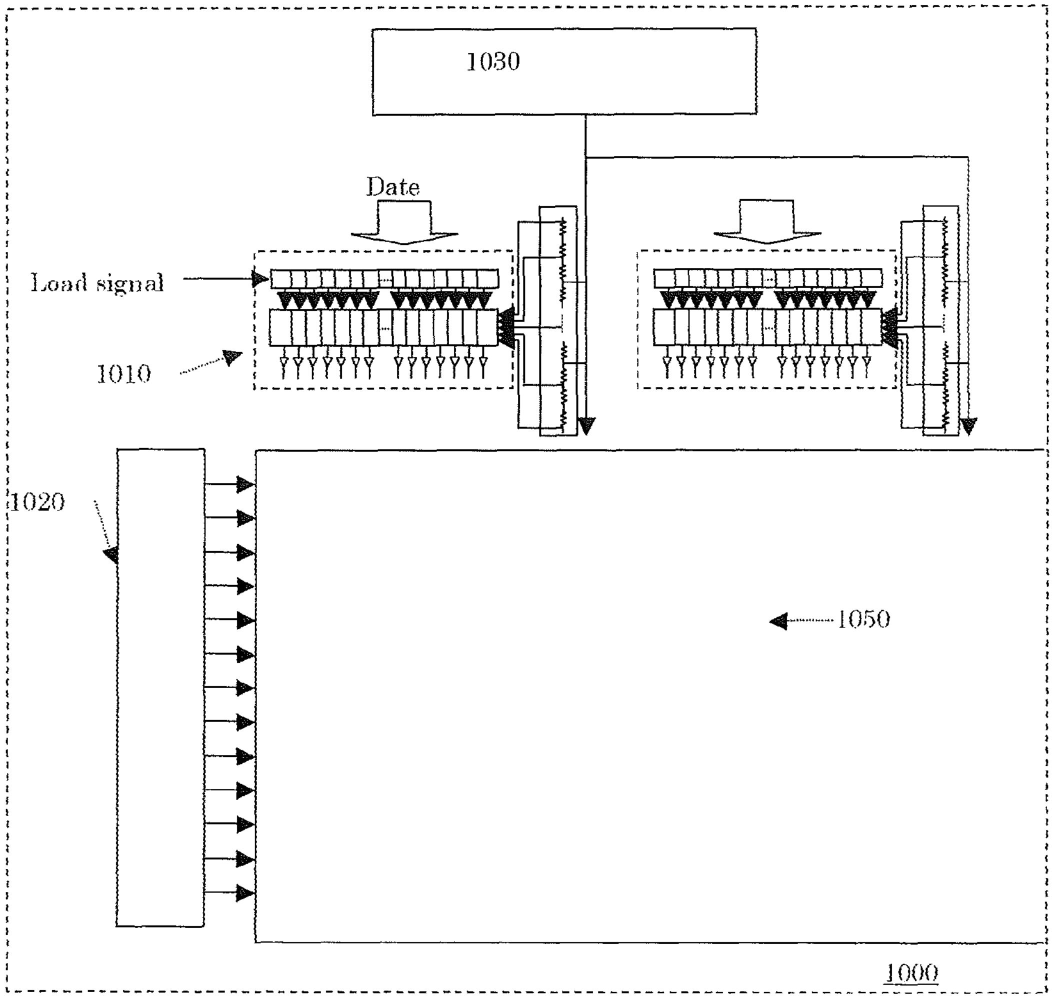
FIG. 10 PRIOR ART
FIG. 10 is a block diagram showing a liquid crystal display device.

FIGS. 4, 5 and 6 show a liquid crystal drive device according to a second embodiment of the present invention. Portions or elements different from those in the first embodiment will be explained in the following description. The second embodiment of the present invention will first be explained using FIGS. 5 and 6. FIG. 5 is a liquid crystal drive device showing the second embodiment in a simple way. FIG. 6 is a timing chart of the liquid crystal drive device shown in FIG. 5. In the liquid crystal drive device 500 shown in FIG. 5, a second gradation voltage generating circuit 520 is different in configuration from that employed in the first embodiment. The second gradation voltage generating circuit 520 includes a string resistor 521, an op amplifier 523 and a switch 525. A predetermined node of the string resistor 521 and the input of the op amplifier 523 are connected to each other. The op amplifier 523 is voltage-follower connected. The output of the op amplifier 523 is connected to a first gradation voltage generating circuit 510 and a DA converter 530 via the switch 525. The switch 525 is controlled so as to be temporarily brought to an on state when the charging of an input capacitance of an op amplifier 540 is started.

Thus, let's cite control on the switch by a LOAD signal by way of example. A variation in node A can be suppressed by temporarily turning on the switch 525 upon charging the input capacitance. Connecting the second gradation voltage generating circuit 520 and the first gradation voltage generating circuit 510 in parallel to the DA converter 530 is temporary. Even though variations in manufacture or the like occur in the op amplifier 523, a liquid crystal display is not so affected by it. In the present embodiment, the input capacitance of an op amplifier 440 can be charged at high speed even though a string resistor 411 and a string resistor 421 are different more or less in gamma curve.

Incidentally, op amplifiers 423 and switches 425 can be disposed at n intervals as shown in FIG. 4. As a matter of course, it is possible to reduce the area of a second gradation voltage generating circuit 420. Such a configuration that each second gradation voltage generating circuit 120 shown in FIG. 1 is provided with the switch 525 is also obviously enabled.

While the preferred forms of the present invention have been described, it is to be understood that modifications will be apparent to those skilled in the art without departing from the spirit of the invention. The scope of the invention is to be determined solely by the following claims.

What is claimed is:

1. A liquid crystal drive device comprising:

first and second string resistors impressed with a same reference voltage;

a first gradation voltage generating circuit having a plurality of first wirings directly led out from interconnection nodes of the first string resistor thereof;

a second gradation voltage generating circuit having a plurality of second wirings led out from interconnection nodes of the second string resistor thereof having a resistance value higher than the first string resistor, each of the second wirings respectively connected to one of a plurality of voltage-follower connected op amplifiers;

a DA (Digital-to-Analog) converter to which the first wirings and outputs of the voltage-follower connected op amplifiers are respectively selectively connected as inputs; and an output op amplifier having an input thereof connected to an output of the DA converter, wherein the voltage-follower connected op amplifiers and the DA converter are respectively selectively connected via switches operated by a control signal.

2. The liquid crystal drive device according to claim 1, wherein each of the switches is operated by the control signal to start an operation of the DA converter.

3. The liquid crystal drive device according to claim 1, wherein a resistance value of the first string resistor ranges from greater than or equal to 10 kΩ to less than or equal to 50 kΩ, and a resistance value of the second string resistor is higher than 50 kΩ.

4. The liquid crystal drive device according to claim 1, wherein the voltage-follower connected op amplifiers are provided at plural intervals of the second wirings.

5. The liquid crystal drive device according to claim 1, wherein the first string resistor and the second string resistor respectively have the same gamma curve.

6. The liquid crystal drive device according to claim 1, wherein each of the switches is temporarily brought to an on state upon starting charging of an input capacitance of the output op amplifier.

7. The liquid crystal drive device according to claim 6, wherein each of the switches is operated by the control signal to start an operation of the DA converter.

* * * * *